United States Patent
Hamao et al.

(10) Patent No.: US 10,763,544 B1
(45) Date of Patent: Sep. 1, 2020

(54) SOLID ELECTROLYTE WITH LOW-SYMMETRY GARNET-RELATED STRUCTURE AND LITHIUM-ION SECONDARY BATTERY

(71) Applicant: National Institute of Advanced Industrial Science and Technology, Tokyo (JP)

(72) Inventors: Naoki Hamao, Ibaraki (JP); Kunimitsu Kataoka, Ibaraki (JP); Junji Akimoto, Ibaraki (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 160 days.

(21) Appl. No.: 16/304,231

(22) PCT Filed: May 2, 2017

(86) PCT No.: PCT/JP2017/017233
§ 371 (c)(1),
(2) Date: Nov. 23, 2018

(87) PCT Pub. No.: WO2017/203954
PCT Pub. Date: Nov. 30, 2017

(30) Foreign Application Priority Data

May 26, 2016 (JP) ................ 2016-104874

(51) Int. Cl.
*H01M 10/0562* (2010.01)
*H01M 10/0525* (2010.01)
*C30B 13/28* (2006.01)
*C30B 29/30* (2006.01)
*C01G 35/00* (2006.01)

(52) U.S. Cl.
CPC ...... *H01M 10/0562* (2013.01); *C01G 35/006* (2013.01); *C30B 13/28* (2013.01); *C30B 29/30* (2013.01); *H01M 10/0525* (2013.01); *C01P 2002/30* (2013.01); *C01P 2002/54* (2013.01); *C01P 2002/72* (2013.01); *C01P 2002/74* (2013.01); *C01P 2002/76* (2013.01); *C01P 2002/77* (2013.01); *C01P 2002/78* (2013.01); *C01P 2002/88* (2013.01); *C01P 2006/10* (2013.01); *C01P 2006/40* (2013.01); *H01M 2300/0077* (2013.01)

(58) Field of Classification Search
CPC ......... H01M 10/0525; H01M 10/0562; H01M 2220/30; H01M 2300/0071; H01M 2300/0077; C30B 13/28; C30B 29/30
See application file for complete search history.

(56) References Cited

U.S. PATENT DOCUMENTS

2017/0222258 A1 8/2017 Kataoka et al.
2017/0324079 A1 11/2017 Kataoka et al.

FOREIGN PATENT DOCUMENTS

| EP | 3176291 A1 | 6/2017 |
| JP | 2011-195373 A | 10/2011 |
| WO | 2016/068040 A1 | 5/2016 |

OTHER PUBLICATIONS

International Search Report issued in PCT/JP2017/017233; dated Jun. 27, 2017.
Junji Awaka et al.; "Synthesis and Structure Analysis of Tetragonal Li7La3Zr2O12 with the Garnet-Related Type Structure", Journal of Solid State Chemistry; 2009; pp. 2046-2052; vol. 182.
N. Hamao et al.; "Synthesis, Crystal Structure and Conductive Properties of Garnet-Type Lithium Ion Conductor Li7—xLa3Zr2—xTaxO12"; 35th Electroceramics Research Colloquium, Presentation Abstracts.
Naoki Hamao et al.; "Synthesis and Conductive Property of Al-Free Garnet-Type Li7—xLa3Zr2—xNbxO12"; The 32nd International Japan-Korea Seminar on Ceramics, Presentation Abstracts.

*Primary Examiner* — Carlos Barcena
(74) *Attorney, Agent, or Firm* — Studebaker & Brackett PC (57) ABSTRACT

A solid electrolyte material having high ion conductivity and a all-solid-state lithium-ion secondary battery using this solid electrolyte material are provided. The solid electrolyte material has a garnet-related structure crystal represented by the chemical composition $Li_{7-x-y}La_3Zr_{2-x-y}Ta_xNb_yO_{12}$ ($0.05 \leq x+y \leq 0.2$, $x \geq 0$, $y \geq 0$), which belongs to an orthorhombic system and a space group belonging to Ibca. The solid electrolyte material has lithium-ion conductivity at 25° C. of at least $1.0 \times 10^{-4}$ S/cm. Also, in this solid electrolyte material, the lattice constants are 1.29 nm$\leq$a$\leq$1.32 nm, 1.26 nm$\leq$b$\leq$1.29 nm, and 1.29 nm$\leq$c$\leq$1.32 nm, and three 16f sites and one 8d site in the crystal structure are occupied by lithium-ions. The all-solid-state lithium-ion secondary battery has a positive electrode, a negative electrode, and a solid electrolyte, the solid electrolyte comprising this solid electrolyte material.

11 Claims, 11 Drawing Sheets

SOLID ELECTROLYTE WITH LOW-SYMMETRY GARNET-RELATED STRUCTURE AND LITHIUM-ION SECONDARY BATTERY

TECHNICAL FIELD

The present invention relates to a solid electrolyte material with a low-symmetry garnet-related structure and an all-solid-state lithium-ion secondary battery using this solid electrolyte.

BACKGROUND ART

Lithium-ion secondary batteries are commonly used in small information devices such as mobile phones and notebook computers because they have a higher energy density than other types of secondary batteries such as nickel cadmium batteries and nickel hydride batteries, and can operate at high potential. Because it is easy to reduce their size and weight, there is growing demand for lithium-ion secondary batteries as secondary batteries in hybrid vehicles and electric vehicles. Because of high safety requirements in automotive applications, all-solid-state lithium-ion secondary batteries that do not use flammable electrolytes have been researched and developed. The solid electrolytes used in all-solid-state lithium-ion secondary batteries require high ion conductivity.

Materials having cubic garnet-related structures have been reported to have high ion conductivity (see, for example, Patent Document 1), and materials having this structure are currently being researched and developed. Materials with the chemical structure $Li_{7-x}La_3Zr_{2-x}Nb_xO_{12}$ have been reported to have high ion conductivity near x=0.25. Because grain boundary resistance and interface resistance have to be reduced as much as possible to realize high ion conductivity, solid materials in the form of high-density compacts are desired. Solid materials in the form of high-density compacts also hold out the possibility of reducing the size of all-solid-state lithium-ion secondary batteries because they can prevent short circuits between the positive and negative electrodes during the charge and discharge cycle and can be produced in the form of slices. However, these materials with a garnet-related structure are difficult to sinter, so creation of high-density compacts is known to be difficult.

Garnet-related structures are commonly known to include tetragonal compounds in addition to cubic compounds (see, for example, Patent Document 1 and Non-Patent Document 1). However, solid lithium electrolytes having garnet-related structures with crystal systems that are not cubic or tetragonal have not been reported. Those with garnet-related structures are expected to have high lithium ion conductivity even when symmetry is low.

CITATION LIST

Patent Literature

Patent Document 1: JP 2011-195373 A

Non-Patent Literature

Non-Patent Document 1: J. Awaka, N. Kijima, H. Hayakawa, J. Akimoto, Journal of Solid State Chemistry, 182, pp. 2046-2052 (2009)

Non-Patent Document 2: N. Hamao, K. Kataoka, M. Kijima, and J. Akimoto, 35th Electroceramics Research Colloquium, Presentation Abstracts Non-Patent Document 3: N. Hamao, K. Kataoka, J. Akimoto, The 32nd International Japan-Korea Seminar on Ceramics, Presentation Abstracts

SUMMARY OF INVENTION

Technical Problem

In view of present circumstances, it is an object of the present invention to provide a high-density, lithium-containing, garnet-related structure crystal having lower symmetry than cubic and tetragonal crystals, and to provide a high-density, lithium-containing, garnet-related structure sintered compact.

Solution to Problem

The present inventors devised a manufacturing method to obtain a high-density $Li_{7-x-y}La_3Zr_{2-x-y}Ta_xNb_yO_{12}$ ($0.05 \leq x+y \leq 0.2$, $x \geq 0$, $y \geq 0$) crystal without grain boundaries that was believed to solve this problem. However, when this lithium-containing, garnet-related structure crystal was heated at high temperatures, the lithium became volatilized. This causes a lithium deficiency and decomposition resulting in lanthanum zirconium oxide. Also, when a material having the same composition as the target lithium-containing, garnet-related structure crystals is used to grow crystals at a growth rate of 4 mm/h, a single crystal of lanthanum zirconium oxide is obtained instead of the target crystals.

When crystals are grown using the melting method from raw materials containing volatile components, the volatilized gas stagnates in the molten portion and destabilizes the growth process. This makes it difficult to grow a single crystal. Because of this concern, a single crystal with a garnet-related structure cannot be grown using the FZ method or CZ method. A phase structure has also been reported when the temperature is raised to the point of melting a garnet-related structure.

The present inventors conducted extensive research on a method for manufacturing a $Li_{7-x-y}La_3Zr_{2-x-y}Ta_xNb_yO_{12}$ ($0.05 \leq x+y \leq 0.2$, $x \geq 0$, $y \geq 0$) sintered compact in which the raw material is heated to a high temperature and cooled. As a result, they discovered that the production of lanthanum zirconium oxide due to lithium volatilization could be suppressed by combining an appropriate amount of lithium with a suitable crystal growth rate, and that volatilized gas could be quickly released from the molten portion without stagnating in the molten portion by rotating the raw material at high speed, thereby stabilizing single crystal growth. The ability to grow a $Li_{7-x-y}La_3Zr_{2-x-y}Ta_xNb_yO_{12}$ ($0.05 \leq x+y \leq 0.2$, $x \geq 0$, $y \geq 0$) crystal with a high-density garnet-related structure was confirmed. The ability to mechanically form slices of this garnet-related structure crystal was also confirmed.

Because this garnet-related structure crystal had a novel garnet-related structure, the present inventors conducted research to determine whether a sintered compact with the same composition could be produced. As a result, they confirmed that a crystal with suppressed lithium volatilization could be produced using an embedding method in which a compacted sintered material is covered with mother powder. Also, it was confirmed that when at least some of the niobium (x) and tantalum (y) in $Li_{7-x-y}La_3Zr_{2-x-y}Ta_xNb_yO_{12}$ was changed so that $0.2 < x+y \leq 0.6$, a sintered compact could be produced which combined the characteristics of an orthorhombic garnet-related structure sintered compact with low activation energy and a cubic garnet-related structure sintered compact with high ion conductivity.

The present inventors also discovered that they could produce a rod of a high-density $Li_{7-x-y}La_3Zr_{2-x-y}Ta_xNb_yO_{12}$ (0.05≤x+y≤0.2, x≥0, y≥0) sintered compact by forming a $Li_{(7-x-y)z}La_3Zr_{2-x-y}Ta_xNb_yO_{12}$ (0.05≤x+y≤0.2, x≥0, y≥0, 1<z≤2) polycrystal into a rod and then melting and rapidly cooling the polycrystal with the FZ method using infrared focused heating. Because the high-density rod was very strong, it could be easily cut using a diamond cutter into slices with a thickness of about 0.1 mm without any unintended breakage occurring.

The present invention is a garnet-related structure crystal represented by the chemical composition $Li_{7-x-y}La_3Zr_{2-x-y}Ta_xNb_yO_{12}$ (0.05≤x+y≤0.2, x≥0, y≥0), the crystal structure being an orthorhombic system. The present invention is also a garnet-related structure sintered compact comprising a garnet-related structure crystal of the present invention and a crystal having cubic garnet-related structure crystal represented by the chemical composition $Li_{7-x-y}La_3Zr_{2-x-y}Ta_xNb_yO_{12}$ (0.2<x+y≤0.6, x≥0, y≥0). The present invention is also a all-solid-state lithium-ion secondary battery comprising a positive electrode, a negative electrode, and a solid electrolyte containing a garnet-related structure crystal of the present invention or a garnet-related structure sintered compact of the present invention.

The present invention is also a method for manufacturing a garnet-related structure crystal belonging to an orthorhombic system represented by the chemical composition $Li_{7-x-y}La_3Zr_{2-x-y}Ta_xNb_yO_{12}$ (0.05≤x+y≤0.2, x≥0, y≥0), the method comprising melting at least a portion of a raw material represented by the chemical composition $Li_{(7-x-y)z}La_3Zr_{2-x-y}Ta_xNb_yO_{12}$ (0.05≤x+y≤0.2, x≥0, y≥0, 1<z≤2) to form a molten portion for crystal growth; moving the molten portion for crystal growth to an uncrystallized raw material at a traveling rate of at least 8 mm/h; and conducting crystal growth.

Advantageous Effects of Invention

The present invention is able to provide a solid electrolyte material having high ion conductivity and low activation energy.

DESCRIPTION OF EMBODIMENTS

The following is a detailed description of crystals, sintered compacts, solid electrolytes, all-solid-state lithium-ion secondary batteries, and crystal manufacturing methods according to the present invention with reference to embodiments and examples. Redundant explanations have been omitted.

The present invention is a garnet-related structure crystal represented by the chemical composition $Li_{7-x-y}La_3Zr_{2-x-y}Ta_xNb_yO_{12}$ (0.05≤x+y≤0.2, x≥0, y≥0), in which the crystal structure is an orthorhombic system. In the garnet-related structure crystal of the present embodiment, the space group showing symmetry in the crystal structure belongs to Ibca. The structure of the garnet-related structure crystal of the present embodiment is a garnet structure such as YAG represented by the general formula $C_3A_2B_3O_{12}$. In this crystal structure, the B site having tetrahedral coordination with oxygen is an unoccupied void and this void is occupied by Li.

In other words, the garnet-related structure crystal of the present embodiment has a crystal structure in which the A site is occupied by La, the C site is occupied by at least one type selected from among Zr, Nb, and Ta, and the void is occupied by Li. Because the garnet-related structure crystal of the present embodiment is that of an orthorhombic crystal with lower symmetry than a cubic crystal, there are three types of independent A site, two types of independent C site, and six types of independent oxygen site. The crystal system of the garnet-related structure crystal of the present embodiment differs from previously reported garnet-related structures in terms of the space groups in the crystal structure and the lithium ion arrangement. More specifically, previously reported garnet-related structure crystals are cubic or tetragonal crystals, and the space groups showing symmetry in the crystal structure are Ia-3d in the case of the cubic crystals and I41/acd in the case of the tetragonal crystals.

For example, in the case of cubic crystals, there is one type of independent site for each of the A site, C site, and oxygen ion site. When indicated at the Wykoff position, the A site is site 24c, the C site is site 16a, and the oxygen ion site is site 96h. There are two types for Li ions, and the sites occupied by lithium ions are one type of site 24d and one type of site 96h. In contrast, the compound in the present embodiment has an orthorhombic crystal system and the space group showing symmetry in the crystal structure is Ibca. The A site has three types of independent site at 8c, 8d and 8e, the C site has two types of independent site at 8a and 8b, and oxygen ions occupy six types of site 16f. Lithium ions occupy three types of site 16f and one type of site 8d.

The Wykoff position is notation indicating sets of equivalent positions in a chemical structure, and consists of a number for equivalent points in a crystal structure known as the multiplicity and a letter assigned alphabetically from the position of highest symmetry. In the compound of the present embodiment, the Li sites differ from those of a conventional garnet-related structure and the lithium ion occupancy is different. The lithium ion electrolyte readily diffuses lithium ions because of the presence of a moderate number of voids at the sites occupied by lithium ions. As a result, activation energy can be expected to be lower and lithium ion conductivity better.

In order to create a crystal without voids, the molten portion of the rod-shaped material is preferably lowered at a rate of at least 8 mm/h while rotating the rod-shaped material at a rotational speed of at least 30 rpm, and the molten portion is rapidly cooled. A rod of the resulting high-density $Li_{7-x-y}La_3Zr_{2-x-y}Ta_xNb_yO_{12}$ ($0.05 \leq x+y \leq 0.2$, $x \geq 0$, $y \geq 0$) crystal is cut to a predetermined thickness using a diamond cutter. The garnet-related structure crystal of the present embodiment is preferably produced by melting a material mixture with the amount of lithium exceeding the stoichiometric ratio of each metal in the chemical composition $Li_{7-x-y}La_3Zr_{2-x-y}Ta_xNb_yO_{12}$ ($0.05 \leq x+y \leq 0.2$, $x \geq 0$, $y \geq 0$) in order to take into account lithium volatilization at high temperatures.

More specifically, the garnet-related structure crystal of the present embodiment can be produced by melting at least a portion of a raw material represented by the chemical composition $Li_{(7-x-y)z}La_3Zr_{2-x-y}Ta_xNb_yO_{12}$ ($0.05 \leq x+y \leq 0.2$, $x \geq 0$, $y \geq 0$, $1 < z \leq 2$) to form a molten portion for crystal growth, moving the molten portion for crystal growth to an uncrystallized raw material at a traveling rate of at least 8 mm/h, and conducting crystal growth.

As long the molten portion for crystal growth is moved at a traveling rate of at least 8 mm/h, the garnet-related structure crystal of the present embodiment can be grown using a method other than the FZ method, such as the Czochralski (CZ) method, the Bridgman-Stockbarger method, or the pedestal method. Crystal growth is preferably conducted while rotating the material at a rotational speed of at least 30 rpm around a central axis parallel to the direction of movement. The proper method should be selected based on the size and shape of the $Li_{7-x-y}La_3Zr_{2-x-y}Ta_xNb_yO_{12}$ ($0.05 \leq x+y \leq 0.2$, $x \geq 0$, $y \geq 0$) crystal to be manufactured.

The relative density of a garnet-related structure crystal of the present embodiment is preferably at least 99%. The relative density is obtained by measuring the outer profile of the slice, calculating the apparent volume, and dividing the apparent volume calculated form the measured mass by the true density obtained from the results of a single crystal X-ray structural analysis. In a garnet-related structure crystal of the present embodiment, a higher relative density is better. In a garnet-related structure crystal of the present embodiment, all of the crystal domains do not have to face the same direction.

When a high proportion of the crystal domains are aligned in the same direction, the diffraction spots are observed in an X-ray diffraction method using a single crystal as clear points. In a sample of cubic $Li_{7-x}La_3Zr_{2-x}Nb_xO_{12}$ crystal in which the crystal domains are not aligned, the diffraction spots are crowded, the various domains overlap, and the diffraction spots form something similar to a ring shape. Because the garnet-related structure crystal is created while moving the molten portion at 10 mm/h in the FZ method, the cooling of the molten portion is too quick and crystal domains cannot be grown with a uniform orientation in the sample.

Figure 4:
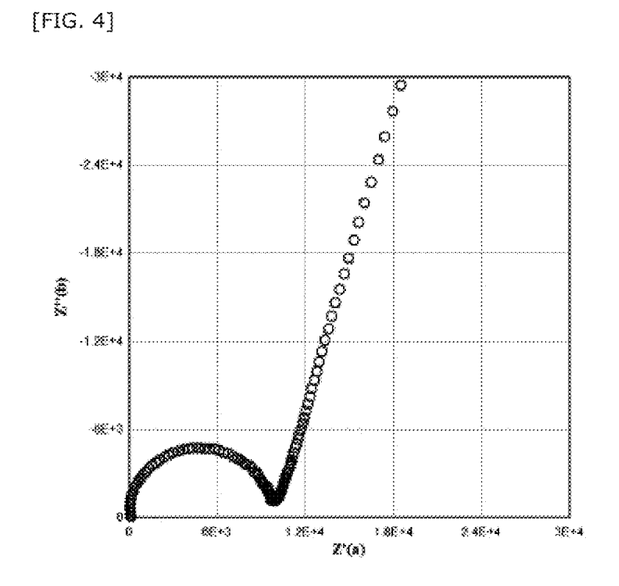
FIG. 4 is a Nyquist plot of the $Li_{6.95}La_3Zr_{1.95}Nb_{0.05}O_{12}$ single crystal obtained in Example 1.

Because the relative density of a polycrystal is difficult to increase, many voids can be found in the results of an alternating current impedance measurement. In a previously reported $Li_7La_3Zr_2O_{12}$ polycrystal, the Nyquist plot from an alternating current impedance measurement shows two resistance components, namely, a resistance component due to grain boundaries and a resistance boundary due to the material itself (see Non-Patent Document 1). In contrast, the Nyquist plot of the garnet-related structure crystal of the present embodiment shown in FIG. 4 does not show a resistance component due to grain boundaries, only a resistance boundary due to the material itself. The diffraction spots of the garnet-related structure crystal of the present embodiment appear to have a ring shape in the diffraction patterns obtained from X-ray diffraction measurements, neutron diffraction measurements and electron diffraction measurements using single crystals.

The present inventors conducted extensive research on a method in which a raw material containing an excess amount of lithium compared to the compositional ratio of the target garnet-related structure crystal is melted at high temperature and then cooled. As a result, they discovered that they could create a $Li_{7-x-y}La_3Zr_{2-x-y}Ta_xNb_yO_{12}$ ($0.05 \leq x+y \leq 0.2$, $x \geq 0$, $y \geq 0$) single crystal of a garnet-related structure crystal with an orthorhombic system, and that they could mechanically cut this single crystal into slices. When a garnet-related structure single crystal with an orthorhombic system is grown using the FZ method, the sample rod is usually rotated at a speed of no more than 20 rpm and lowered at a rate of about 2 mm/h. Under these conditions, voids appear in the $Li_{7-x-y}La_3Zr_{2-x-y}Ta_xNb_yO_{12}$ ($0.05 \leq x+y \leq 0.2$, $x \geq 0$, $y \geq 0$), and a high-density crystal cannot be produced.

Because the garnet-related structure crystal of the present embodiment has a high density, it can be easily cut to the desired thickness using a diamond cutter. The garnet-related structure crystal of the present embodiment also has high ion conductivity. More specifically, the lithium ion conductivity at 25° C. is $1.0 \times 10^{-4}$ S/cm or higher and the activation energy is 0.4 eV or lower. A $Li_{7-x-y}La_3Zr_{2-x-y}Ta_xNb_yO_{12}$ ($0.05 \leq x+y \leq 0.2$, $x \geq 0$, $y \geq 0$) crystal with a relative density of 100%, that is, a $Li_{7-x-y}La_3Zr_{2-x-y}Ta_xNb_yO_{12}$ ($0.05 \leq x+$ y≤0.2, x≥0, y≥0) single crystal, can be produced using the FZ method. A crystal with a relative density of 100% has excellent lithium ion conductivity.

When a garnet-related structure crystal of the present embodiment is produced using the FZ method, the rod-shaped material is preferably melted while being rotated on a plane orthogonal to the longitudinal direction at a rotational speed of at least 30 rpm, and the molten portion is moved in the longitudinal direction to conduct crystal growth. By increasing the traveling rate of the molten portion to 8 mm/h or more, decomposition of the material associated with lithium volatilization is avoided. The traveling rate of the molten portion is preferably 8 mm/h or more and 19 mm/h or less. Because gas bubbles occur when the lithium attempts to volatilize in the molten portion, gas bubbles can be eliminated by increasing the rotational speed of the rod-shaped material to 30 rpm or more. The rotational speed of the material is preferably 30 rpm or more and 60 rpm or less. The material is preferably melted and the molten portion moved in a dry air atmosphere.

In this way, a $Li_{7-x-y}La_3Zr_{2-x-y}Ta_xNb_yO_{12}$ (0.05≤x+y≤0.2, x≥0, y≥0) crystal can be produced with a relative density of 99% or more. The following is an explanation of a method for producing a garnet-related structure crystal of the present embodiment using the growth of a $Li_{7-x-y}La_3Zr_{2-x-y}Ta_xNb_yO_{12}$ (0.05≤x+y≤0.2, x≥0, y≥0) crystal with a relative density of 99% or more, an orthorhombic system, and a garnet-related structure as an example.

First, the rod-shaped material is prepared in the following manner. In order to take into account volatilization of lithium at high temperatures, a lithium compound, lanthanum compound, zirconium compound, niobium compound, and tantalum compound are weighed out to obtain a Li:La:Zr:Nb:Ta molar ratio of (7−x−y)z:3:2−x−y:x:y (0.05≤x+y≤2, x≥0, y≥0, 1<z≤2).

The lithium compound can be any compound containing lithium. Examples include oxides such as $Li_2O$ and carbonates such as $Li_2CO_3$. The lanthanum compound can be any compound containing lanthanum. Examples include oxides such as $La_2O_3$ and hydroxides such as $La(OH)_3$. The zirconium compound can be any compound containing zirconium. Examples include oxides such as $ZrO_2$ and chlorides such as $ZrCl_4$. The niobium compound can be any compound containing niobium. Examples include oxides such as $Nb_2O_5$ and chlorides such as $NbCl_5$. The tantalum compound can be any compound containing tantalum. Examples include oxides such as $Ta_2O_5$ and chlorides such as $TaCl_5$.

Also, a compound containing two or more types selected from among lithium, lanthanum, zirconium, niobium, and tantalum may be weighed out to obtain a Li:La:Zr:Nb:Ta molar ratio of (7−x−y)z:3:2−x−y:x:y (0.05≤x+y≤0.2, x≥0, y≥0, 1<z≤2). Examples containing two or more types of these metals include lanthanum zirconium oxides such as $La_2Zr_2O_7$, lanthanum niobium oxides such as $LaNbO_4$, lithium niobium oxides such as $LiNbO_3$, lithium zirconium oxide such as $Li_2ZrO_3$, and lithium tantalum oxide such as $LiTaO_3$.

Next, the weighed-out compounds are mixed together. There are no particular restrictions on the mixing method as long as each compound can be mixed uniformly. The compounds may be mixed together using a wet or dry method in a mixer. After filling a crucible with a cover with the resulting mixture, preliminary firing is performed at a temperature from 600° C. to 900° C., and preferably at 850° C., to obtain a raw material powder. The preliminarily sintered raw material is preferably repeatedly pulverized, mixed, and sintered.

Next, the resulting raw material powder is pulverized to a finer particle size for easier compacting. There are no particular restrictions on the pulverization method as long as the powder can be made finer. The pulverizing may be performed with a wet or dry method using a pulverizing device such as a planetary ball mill, pot mill, or bead mill. A rubber tube is filled with the pulverized material and compacted into a rod shape using a hydrostatic press. The rod-shaped compact is then fired for four hours at a temperature from 700° C. to 1,300° C., preferably from 800° C. to 1,150° C., to obtain a rod-shaped material. At this time, the chemical composition of the raw material is $Li_{(7-x-y)z}La_3Zr_{2-x-y}Nb_xTa_yO_{12}$ (0.05≤x+y≤0.2, x≥0, y≥0, 1<z≤2). A rod-shaped raw material can be produced in this manner.

After melting the rod-shaped material in an IR furnace while rotating the material at a rotational speed of at least 30 rpm, it is moved at a speed of 8 mm/h or more and 19 mm/h or less and rapidly cooled to produce a $Li_{7-x-y}La_3Zr_{2-x-y}Ta_xNb_yO_{12}$ (0.05≤x+y≤0.2, x≥0, y≥0) crystal with a relative density of 99% or more, an orthorhombic system, and a garnet-related structure. A $Li_{7-x-y}La_3Zr_{2-x-y}Ta_xNb_yO_{12}$ (0.05≤x+y≤0.2, x≥0, y≥0) crystal with a length of 2 cm or more can be obtained using this method. As a result, slices of uniform quality can be easily produced by cutting.

The following process is used to produce a high-density $Li_{7-x-y}La_3Zr_{2-x-y}Ta_xNb_yO_{12}$ (0.05≤x+y≤0.2, x≥0, y≥0) crystal using the CZ method. First, the raw materials are added to a crucible, heated, and melted. Next, a seed crystal is added to the molted raw material and pulled out while rotating. Because the rate at which the molten portion is moved, that is, the rate at which the seed crystal is pulled out, is a fast 8 mm/h or higher, lithium volatilization is suppressed, and a high-density $Li_{7-x-y}La_3Zr_{2-x-y}Ta_xNb_yO_{12}$ (0.05≤x+y≤0.2, x≥0, y≥0) is believed to be obtained.

A garnet-related structure crystal of the present embodiment can be produced by mixing together raw materials added to obtain a chemical composition of $Li_{(7-x-y)z}La_3Zr_{2-x-y}Ta_xNb_yO_{12}$ (0.05≤x+y≤0.2, x≥0, y≥0, 1<z≤2), performing preliminary firing to obtain a mixed powder (the "mother powder" below), compacting the powder, covering the compact with mother powder using the embedding method, and then firing the compact at a temperature of at least 1,000° C.

It is well known that a cubic garnet-related structure crystal or a cubic garnet-related structure/tetragonal garnet-related structure sintered compact can be obtained by producing a crystal using 1.2 times the stoichiometric amount of lithium (see Non-Patent Document 2 and Non-Patent Document 3). However, an orthorhombic garnet-related structure crystal or an orthorhombic garnet-related structure/cubic garnet-related structure sintered compact can be obtained by using 1.5 times the stoichiometric amount of lithium.

A garnet-related structure sintered compact in an embodiment of the present invention contains a garnet-related structure crystal of the present embodiment and a cubic garnet-related structure crystal represented by the chemical composition $Li_{7-x-y}La_3Zr_{2-x-y}Ta_xNb_yO_{12}$ (0.2<x+y≤0.6, x≥0, y≥0). A garnet-related structure sintered compact is obtained by adjusting the Zr:Nb:Ta molar ratio in the raw material to 2−x−y:x:y (0.2<x+y≤0.6, x≥0, y≥0). This garnet-related structure sintered compact is a two-phase mixture of an orthorhombic garnet-related structure crystal and a cubic garnet-related structure crystal. When x+y=0.4, a garnet-related structure sintered compact with especially low activation energy and high lithium ion conductivity is obtained.

Because the garnet-related structure crystal and garnet-related structure sintered compact in the present embodiments have excellent lithium ion conductivity, they can be used in all-solid-state lithium-ion secondary batteries, lithium-air batteries, and lithium-sulfur batteries. The all-solid-state lithium-ion secondary battery in an embodiment of the present invention comprises a positive electrode, a negative electrode, and a solid electrolyte containing the garnet-related structure crystal or the garnet-related structure sintered compact in the present embodiments. When this solid electrolyte is used in a lithium-air battery, it can also function as a separator preventing direction contact between the lithium metal used on the negative electrode side and the air used on the positive electrode side.

The solid electrolyte material in the present embodiment is advantageous as a highly dense solid electrolyte because it prevents leakage of air from a lithium-air battery. A solid electrolyte having high ion conductivity similar to that of a all-solid-state lithium-ion secondary battery is required for a lithium-sulfur battery because the sulfur used in the positive electrode readily dissolves in a liquid electrolyte during the discharge cycle. The following is a more detailed description of the present invention with reference to examples. The present invention is not limited in any way by these examples.

EXAMPLES

Example 1: Production of $Li_{6.95}La_3Zr_{1.95}Nb_{0.05}O_{12}$ Crystal Using the FZ Method (Mixing of Raw Materials)

First, 7.972 g of lithium carbonate $Li_2CO_3$ (from Rare Metallic, purity: 99.99%), 12.620 g of lanthanum oxide $La_2O_3$ (from Rare Metallic, purity: 99.99%), 6.22 g of zirconium oxide $ZrO_2$ (from Rare Metallic, purity: 99.99%), and 0.172 g of niobium oxide $Nb_2O_5$ (from Rare Metallic, purity: 99.99%) were added to an agate mortar and mixed uniformly using ethanol in the wet method. The lanthanum oxide had already been subjected to preliminary firing at 900° C. The Li:La:Zr:Nb molar ratio in this mixture included 20 mol % more lithium than the stoichiometric ratio for the $Li_{6.95}La_3Zr_{1.95}Nb_{0.05}O_{12}$ target. In other words, the amounts correspond to a chemical composition of $Li_{8.34}La_3Zr_{1.95}Nb_{0.05}O_{12}$.

Next, 26.113 g of the mixture was packed in an alumina crucible with a cover (Model C3 from Nikkato). This was placed in a box-type electric furnace (Model FP100 from Yamato Scientific) and subjected to preliminary firing for six hours at 850° C. to obtain a powder. The resulting powder was then pulverized. Specifically, 36 g of the powder, 50 g of zirconia balls with a diameter of 5 mm, and 14 mL of ethanol were added to a zirconia container and pulverized for 300 minutes at 200 rpm using a planetary ball mill (Model P-6 from Fritsch). The pulverized powder was dried for 24 hours at 100° C. and then classified using a 250 μm-mesh sieve.

(Preparation of Rod-Shaped Material)

The mixed powder was passed through a sieve and used to produce a plate-like raw material using the following steps. First, 20.497 g was packed into a rubber mold and degassed. The sealed mold was placed in water and subjected to 40 MPa of pressure for five minutes. The water pressure was then reduced and the compact was removed from the mold. The compact was rod-like and had a diameter of 1.0 cm and a height of 9.6 cm. Next, the rod-like compact was sintered at 1,150° C. using a box-type electric furnace (Model No. KDF009 from Denken). The sintered compact was rod-like and had a diameter of 0.94 cm and a height of 9.2 cm.

(Growing of $Li_{6.95}La_3Zr_{1.95}Nb_{0.05}O_{12}$ Crystal)

Figure 1:
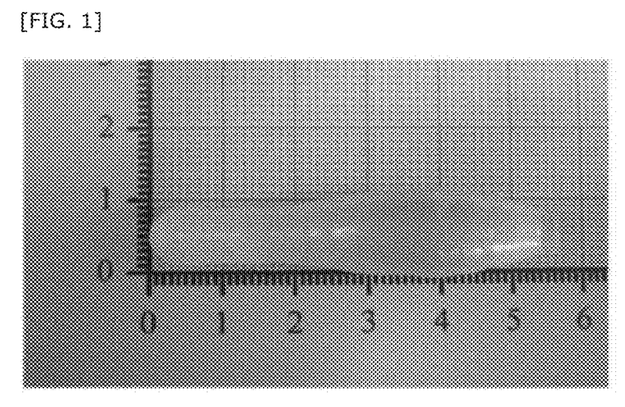
FIG. 1 is an exterior photograph of the $Li_{6.95}La_3Zr_{1.95}Nb_{0.05}O_{12}$ obtained in Example 1.

The rod-shaped material was then placed in a four-ellipsoidal mirror IR furnace (FZ furnace) equipped with a 1 kW halogen lamp (Model FZ-T-10000H from Crystal System) and dried in an air atmosphere. Next, the rod-shaped material was rotated at 40 rpm on the plane orthogonal to the longitudinal direction and heated at an output of 25.9%. After a short time, some of the material melted to form a molten portion. The platform holding the rod-shaped material was lowered at a rate of 10 mm/h, and a high-density $Li_{6.95}La_3Zr_{1.95}Nb_{0.05}O_{12}$ crystal was grown ("Sample 1") below. The chemical composition of Sample 1 was determined by X-ray crystal structural analysis. As shown in FIG. 1, a 5 cm-long, high-density $Li_{6.95}La_3Zr_{1.95}Nb_{0.05}O_{12}$ crystal was created.

(Evaluation of $Li_{6.95}La_3Zr_{1.95}Nb_{0.05}O_{12}$ Crystal)

Figure 2:
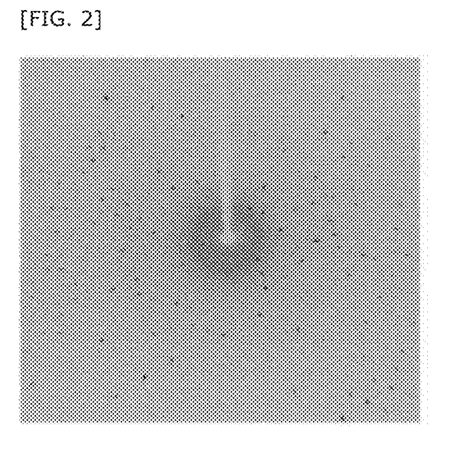
FIG. 2 is a powder X-ray diffraction pattern of the $Li_{6.95}La_3Zr_{1.95}Nb_{0.05}O_{12}$ obtained in Example 1.

The structure of Sample 1 was examined using a single crystal X-ray diffraction device with a two-dimensional IP detector and a scintillation counter in the detector (R-AXIS RAPID-II from Rigaku). The X-ray diffraction pattern of Sample 1 is shown in FIG. 2. As shown in FIG. 2, a clear diffraction point was measured. Diffraction intensity data was collected on Sample 1 and the crystal structure was examined using the Jana2006 crystal structural analysis program. Sample 1 was clearly orthorhombic. Sample 1 was cut using a diamond cutter into four 0.1 mm-thick slices, and the relative densities were calculated using the method described above. As a result, the relative densities were 99.8%, 99.2%, 100%, and 99.5%.

Figure 3:
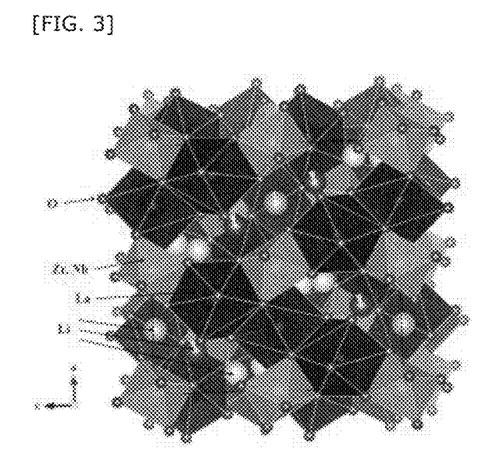
FIG. 3 is a schematic diagram showing the garnet-related structure of the $Li_{6.95}La_3Zr_{1.95}Nb_{0.05}O_{12}$ single crystal obtained in Example 1.

FIG. 3 is a schematic view of the crystal structure in Sample 1. Previously reported garnet-related structure crystals are cubic or tetragonal crystals, and the space groups showing symmetry in the crystal structure are Ia-3d in the case of the cubic crystals and I41/acd in the case of the tetragonal crystals. In the case of cubic crystals, the crystal structure has one type of lanthanum ion site (site 24c), at least one type of cation site (site 16a) selected from among a zirconium ion site, niobium ion site and tantalum ion site, one type of oxygen ion site (site 96h), and two types of lithium ion site (site 24d and site 96h).

In the case of tetragonal crystals, the crystal structure has two types of lanthanum ion site (site 8b, site 16e), at least one type of cation site (site 16c) selected from among a zirconium ion site, niobium ion site and tantalum ion site, three types of oxygen ion site (three types of site 32g), and three types of lithium ion site (site 8a, side 16f and site 32g). Sample 1 has an orthorhombic crystal system having an Ibca space group. The crystal structure has three types of lanthanum ion site (site 8c, site 8d, site 8e), at least two types of cation site (site 8a, site 8b) selected from among a zirconium ion site, niobium ion site and tantalum ion site, six types of oxygen ion site (six types of site 16f), and four of two types of lithium ion site (three sites 16f and one site 8d).

In other words, Sample 1 has three types of lithium ion site at 16f and one type of lithium ion site at 8d. The specific coordinates for Li (x, y, z) are (0.0857, 0.1955, 0.0816), (0.1669, 0.5569, 0.1627), (0.0689, 0.1288, 0.6811), and (0.25, 0.1270, 0). Because the R factor indicating the reliability of the crystal structural analysis was 1.76%, the results of the crystal structural analysis are believed to be valid.

The lithium ion arrangement differs from previously reported tetragonal garnet-related structures in that all four types of lithium ion sites are voids. In other words, the lithium ion occupancy rate is not 1.0. Because of the voids, the energy barrier associated with the migration of lithium ions also decreases. Therefore, the lithium ion conductivity of Sample 1 is believed to be higher than that of tetragonal garnet-related structure compounds. Sample 1 was cut to prepare a slice with a diameter of approximately 0.8 cm and a thickness of approximately 0.10 cm. Gold was sputtered on both the front and rear surfaces of the slice to a thickness of 40 μm in a perfect circle with a diameter of 0.20 cm to form electrodes on a measurement sample.

Figure 5:
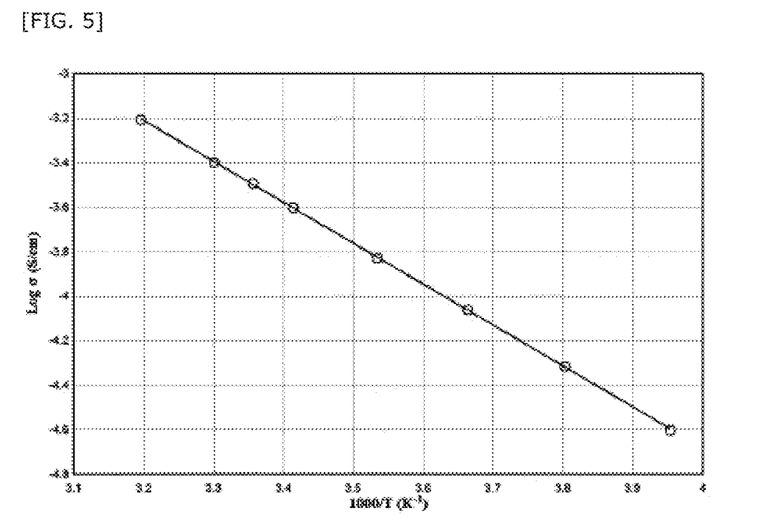
FIG. 5 is an Arrhenius plot of the $Li_{6.95}La_3Zr_{1.95}Nb_{0.05}O_{12}$ single crystal obtained in Example 1.

When the sample was measured at 25° C. in a nitrogen atmosphere using the alternating current impedance method (measuring device: Solarton 1260), the Nyquist plot shown in FIG. 4 was obtained and the lithium ion conductivity was $3.06 \times 10^{-4}$ S/cm. When the ion conductivity was determined in a range from −20° C. to 40° C., the Arrhenius plot shown in FIG. 5 was obtained, and the activation energy was 0.38 eV.

Figure 6:
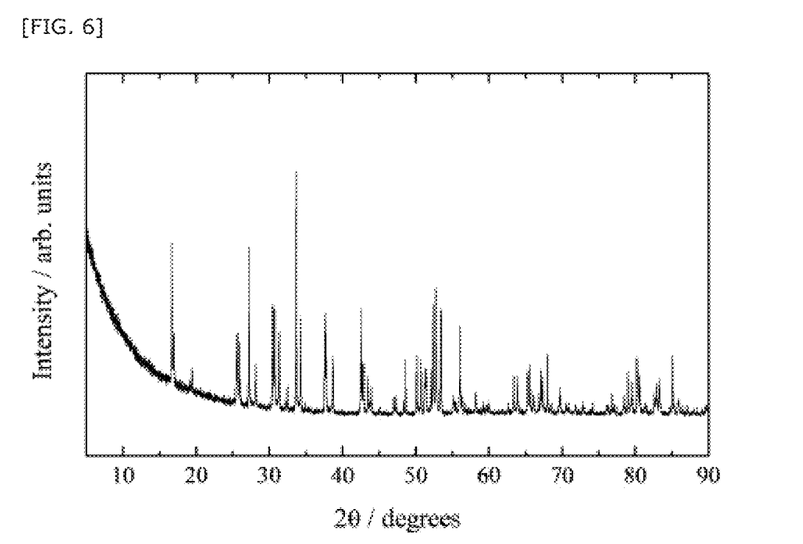
FIG. 6 is a powder X-ray diffraction pattern of the $Li_{6.95}La_3Zr_{1.95}Nb_{0.05}O_{12}$ single crystal obtained in Example 1.

When the lattice constants a, b, c of Sample 1 were determined by the method of least-squares using reflections from a single crystal X-ray diffraction measurement, the results were a=1.31280 nm±0.0002 nm, b=1.26777 nm±0.0003 nm, and c=1.31226 nm 0.0004 nm. It was clear from the lattice constants that Sample 1 was a lithium composite oxide in the form of a garnet-related structure crystal. When Sample 1 was pulverized and subjected to a powder X-ray diffraction measurement, the results shown in FIG. 6 were obtained. The powder X-ray diffraction pattern of Sample 1 was different from the X-ray diffraction patterns of previously reported garnet-related structure crystals used as solid electrolytes. It was clear that Sample 1 is a crystal with a novel crystal structure.

The lattice constants a, b, c calculated from the results of the powder X-ray structural analysis were a=1.31126 nm±0.00008 nm, b=1.26769 nm±0.00001 nm, and c=1.31135 nm±0.00007 nm. When the single crystal X-ray diffraction measurement and powder X-ray structural analysis results were combined, the lattice constants in Sample 1 were 1.311 nm≤a≤1.312 nm, 1.2676 nm≤b≤1.2677 nm, and 1.311 nm≤b≤1.312 nm.

Figure 7:
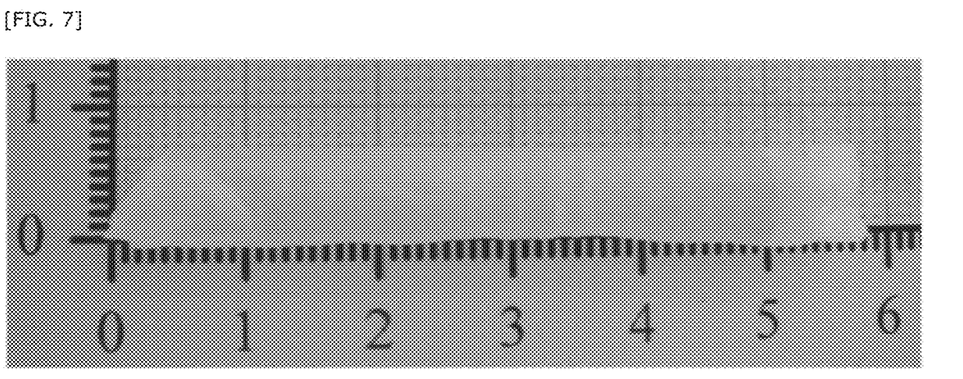
FIG. 7 is an exterior photograph of the $Li_{6.95}La_3Zr_{1.95}Ta_{0.05}O_{12}$ sintered compact obtained in Example 2.
Figure 8:
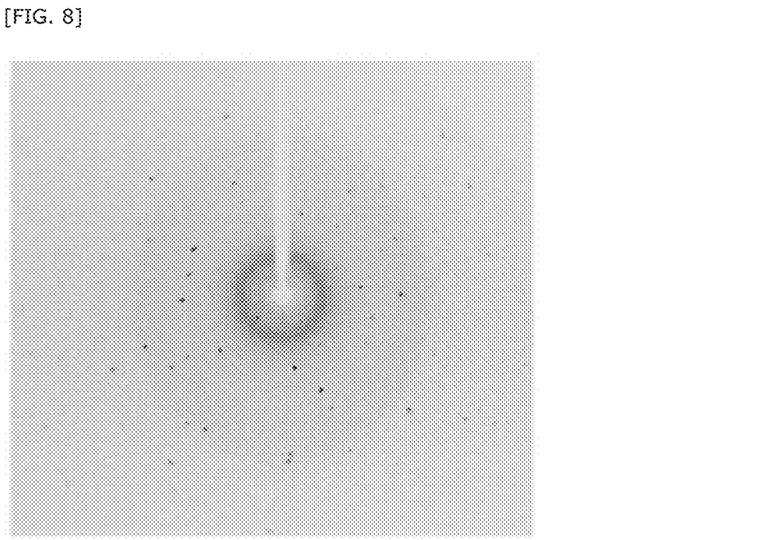
FIG. 8 is a powder X-ray diffraction pattern of the $Li_{6.95}La_3Zr_{1.95}Ta_{0.05}O_{12}$ single crystal obtained in Example 2.
Figure 9:
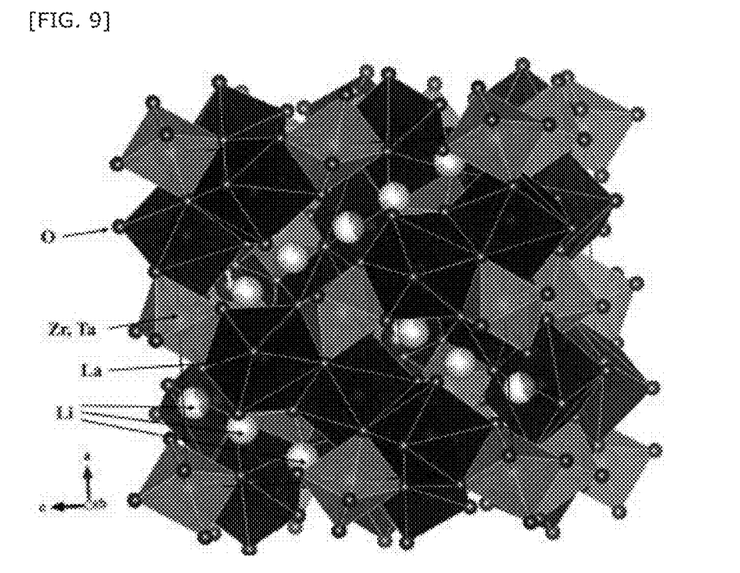
FIG. 9 is a schematic diagram showing the garnet-related structure of the $Li_{6.95}La_3Zr_{1.95}Ta_{0.05}O_{12}$ single crystal obtained in Example 2.

Example 2: Production of $Li_{6.95}La_3Zr_{1.95}Ta_{0.05}O_{12}$ Crystal Using the FZ Method A lithium-containing garnet crystal was manufactured and evaluated in the same manner as Example 1 except that lithium carbonate $Li_2CO_3$, lanthanum oxide $La_2O_3$, zirconium oxide $ZrO_2$, and tantalum oxide $Ta_2O_5$ were mixed together so that the molar ratio of metallic Li:La:Ta:Zr was 8.3:3.0:0.05:1.95, that is, so that x=0.05 and z=1.2 in the $Li_{(7-x)z}La_3Zr_{2-x}Ta_xO_{12}$ raw material. The exterior appearance of Sample 2 is shown in FIG. 7. The X-ray diffraction pattern of Sample 2 is shown in FIG. 8. As shown in FIG. 8, a clear diffraction point was measured. The resulting crystal, like Example 1, was a lithium composite oxide with a novel orthorhombic garnet-related structure. The lattice constants of the crystal were a=1.31073 nm±0.0006 nm, b=1.26803 nm±0.0006 nm, and c=1.30982 nm 0.0008 nm, and the chemical composition was $Li_{6.92}La_3Zr_{1.952}Ta_{0.048}O_{12}$. FIG. 9 is a schematic view of the crystal structure in Sample 2. Because the R factor indicating the reliability of the crystal structural analysis was 4.09%, the results of the crystal structural analysis are believed to be valid.

Figure 10:
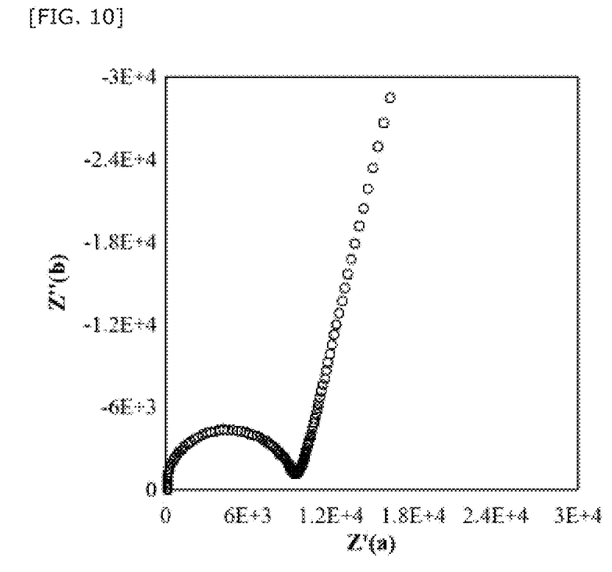
FIG. 10 is a Nyquist plot of the $Li_{6.95}La_3Zr_{1.95}Ta_{0.05}O_{12}$ single crystal obtained in Example 2.
Figure 11:
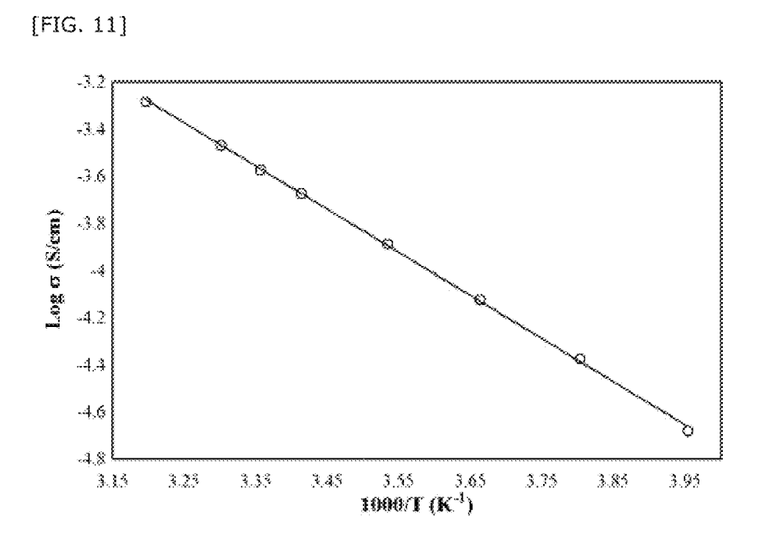
FIG. 11 is an Arrhenius plot of the $Li_{6.95}La_3Zr_{1.95}Ta_{0.05}O_{12}$ single crystal obtained in Example 2.

When the sample was measured at 25° C. in a nitrogen atmosphere using the alternating current impedance method, the Nyquist plot shown in FIG. 10 was obtained and the lithium ion conductivity was $2.68 \times 10^{-4}$ S/cm. When the ion conductivity was determined in a range from −20° C. to 40° C., the Arrhenius plot shown in FIG. 11 was obtained, and the activation energy was 0.39 eV.

Figure 12:
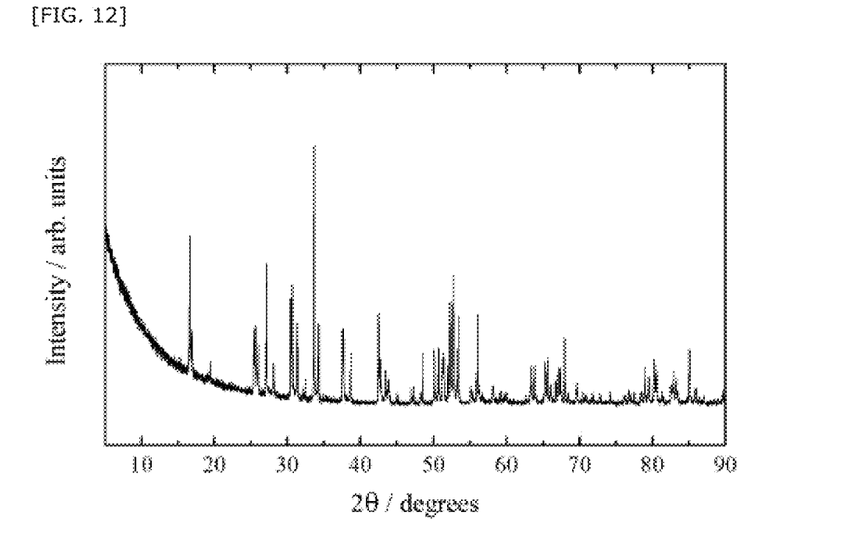
FIG. 12 is a powder X-ray diffraction pattern of the $Li_{6.95}La_3Zr_{1.95}Ta_{0.05}O_{12}$ single crystal obtained in Example 2.

When Sample 2 was pulverized and subjected to a powder X-ray diffraction measurement, the results shown in FIG. 12 were obtained. The lattice constants a, b, c calculated from the results of the powder X-ray structural analysis were a=1.30963 nm±0.00007 nm, b=1.27039 nm±0.00001 nm, and c=1.31187 nm±0.00006 nm. When the single crystal X-ray diffraction measurement and powder X-ray crystal structural analysis results were combined, the lattice constants in Sample 1 were 1.310 nm≤a≤1.311 nm, 1.268 nm≤b≤1.274 nm, and 1.309 nm≤b≤1.312 nm.

Example 3: Production of $Li_{6.95}La_3Zr_{1.90}Ta_{0.025}Nb_{0.025}O_{12}$ Crystal Using the FZ Method A lithium-containing garnet crystal was manufactured and evaluated in the same manner as Example 1 except that lithium carbonate $Li_2CO_3$, lanthanum oxide $La_2O_3$, zirconium oxide $ZrO_2$, tantalum oxide $Ta_2O_5$, and niobium oxide $Nb_2O_5$ were mixed together so that the molar ratio of metallic Li:La:Ta:Nb:Zr was 8.3:3.0:0.025:0.025:1.95, that is, so that x=0.025, y=0.025 and z=1.2 in the $Li_{(7-x+y)z}La_3Zr_{2-x-y}Ta_xNb_yO_{12}$ raw material. The resulting crystal was a lithium composite oxide with an orthorhombic garnet-related structure. The lattice constants of the crystal were a=1.31091 nm±0.0004 nm, b=1.26763 nm 0.0003 nm, and c=1.31082 nm±0.0008 nm, and the chemical composition was $Li_{6.91}La_3Zr_{1.953}Ta_{0.022}Nb_{0.025}O_{12}$. Because the R factor indicating the reliability of the crystal structural analysis was 2.11%, the results of the crystal structural analysis are believed to be valid.

Example 4: Production of $Li_{6.8}La_3Zr_{1.8}Ta_{0.20}O_{12}$ Sintered Compact Using the Embedding Method A powder mixture was prepared in the same manner as the raw material mixture in Example 1 except that lithium carbonate $Li_2CO_3$, lanthanum oxide $La_2O_3$, zirconium oxide $ZrO_2$, and tantalum oxide $Ta_2O_5$ were mixed together so that the molar ratio of metallic Li:La:Ta:Zr was 10.2:3.0:0.20:1.8, that is, so that x=0.20 and z=1.5 in the $Li_{(7-x)z}La_3Zr_{2-x}Ta_xO_{12}$ raw material.

The mixed powder was passed through a sieve and used to produce a plate-like raw material using the following steps. First, 0.7532 g was packed into a tableting machine and 60 MPa of pressure was maintained for five minutes using a hydraulic press. The compact was then removed from the mold. The compact was plate-like and had a diameter of 1.30 cm and a height of 0.15 cm. Next, the plate-like compact was fired for four hours at 1,200° C. using a box-type electric furnace (Model No. KDF009 from Denken). The sintered compact ("Sample 3" below) was plate-like and had a diameter of 1.20 cm and a height of 0.12 cm. An X-ray crystal structural analysis was performed and Sample 2 was found to have a chemical composition of $Li_{6.81}La_3Zr_{1.81}Ta_{0.19}O_{12}$.

Figure 13:
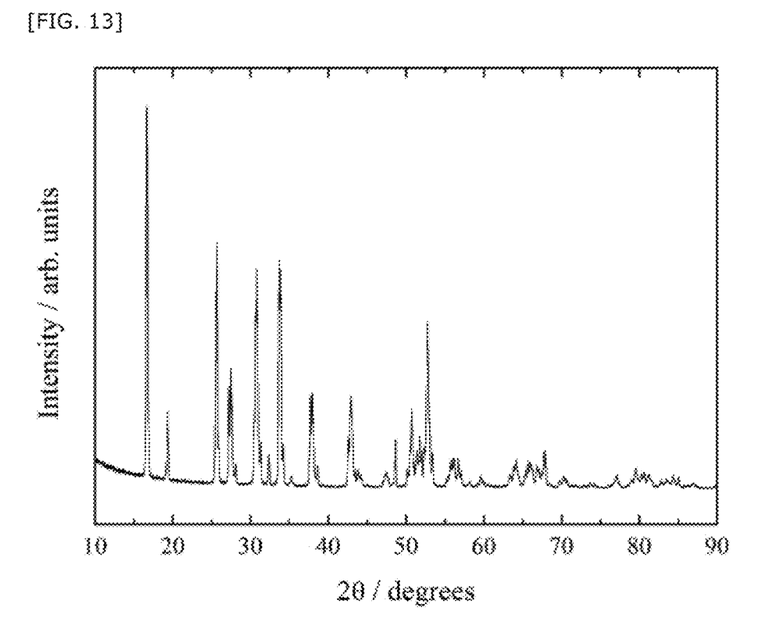
FIG. 13 is a powder X-ray diffraction pattern of the $Li_{6.8}La_3Zr_{1.8}Ta_{0.20}O_{12}$ sintered compact obtained in Example 4.
Figure 14:
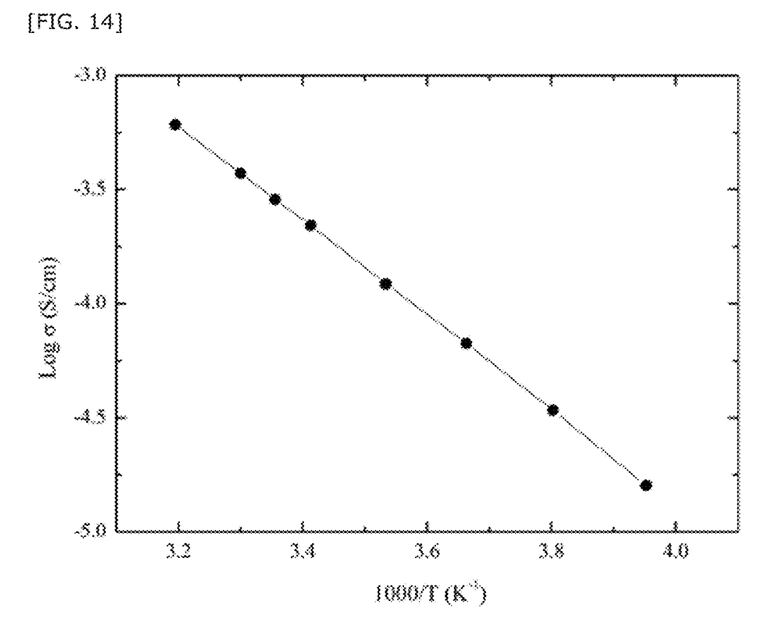
FIG. 14 is an Arrhenius plot of the $Li_{6.8}La_3Zr_{1.8}Ta_{0.20}O_{12}$ sintered compact obtained in Example 4.

When Sample 3 was pulverized and subjected to a powder X-ray diffraction measurement, the results shown in FIG. 13 were obtained. The powder X-ray diffraction pattern of Sample 3 was different from the X-ray diffraction patterns of previously reported garnet-related structure crystals. Therefore, it was clear that Sample 3 was a crystal with a novel crystal structure. The lattice constants a, b, c calculated from the results of the powder X-ray structural analysis were a=1.30905 nm±0.00003 nm, b=1.27437 nm±0.00005 nm, and c=1.29726 nm±0.00003 nm. The lithium ion conductivity at 25° C. was $2.87 \times 10^{-4}$ S/cm. When the ion conductivity was determined in a range from −20° C. to 40° C., the Arrhenius plot shown in FIG. 14 was obtained, and the activation energy was 0.44 eV.

Example 5: Production of $Li_{6.6}La_3Zr_{1.60}Ta_{0.40}O_{12}$ Sintered Compact Using the Embedding Method A sintered compact ("material 4" below) was prepared and evaluated in the same manner as Example 3 except that lithium carbonate $Li_2CO_3$, lanthanum oxide $La_2O_3$, zirconium oxide $ZrO_2$, and tantalum oxide $Ta_2O_5$ were mixed together so that the molar ratio of metallic Li:La:Zr:Ta was 9.9:3.0:1.60:0.40, that is, so that x=0.40 and z=1.5 in the $Li_{(7-x)z}La_3Zr_{2-x}Ta_xO_{12}$ raw material. In the powder X-ray diffraction pattern, Sample 4 was a two-phase sintered compact with an orthorhombic garnet-related structure and a cubic garnet-related structure.

Figure 15:
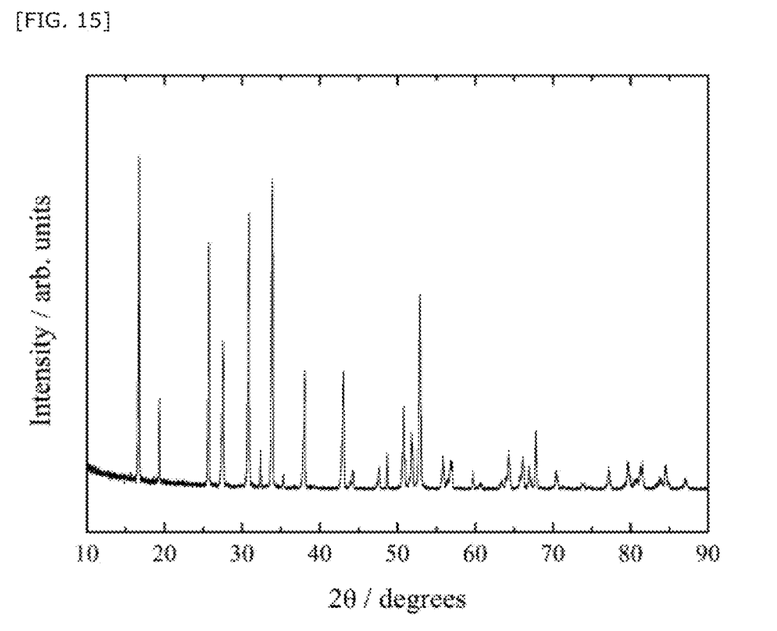
FIG. 15 is a powder X-ray diffraction pattern of the $Li_{6.6}La_3Zr_{1.60}Ta_{0.40}O_{12}$ sintered compact obtained in Example 5.
Figure 16:
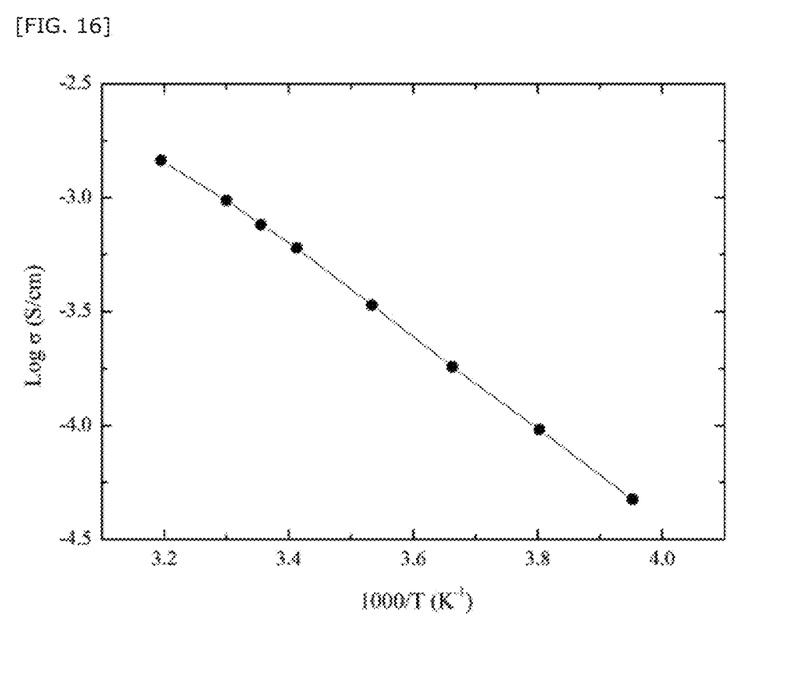
FIG. 16 is an Arrhenius plot of the $Li_{6.6}La_3Zr_{1.60}Ta_{0.40}O_{12}$ sintered compact obtained in Example 5.

When Sample 4 was pulverized and subjected to a powder X-ray diffraction measurement, the results shown in FIG. 15 were obtained. When the ratio of the phases in Sample 4 was calculated using powder X-ray diffraction measurements, it was cubic:orthorhombic=90:10. The lithium ion conductivity at 25° C. was $7.5 \times 10^{-4}$ S/cm. When the ion conductivity was determined in a range from −20° C. to 40° C., the Arrhenius plot shown in FIG. 16 was obtained, the activation energy was 0.42 eV, and the mixture combined high ion conductivity and low activation energy.

Example 6: Production of $Li_{6.4}La_3Zr_{1.40}Ta_{0.60}O_{12}$ Sintered Compact Using the Embedding Method A sintered compact ("material 5" below) was prepared and evaluated in the same manner as Example 4 except that lithium carbonate $Li_2CO_3$, lanthanum oxide $La_2O_3$, zirconium oxide $ZrO_2$, and tantalum oxide $Ta_2O_5$ were mixed together so that the molar ratio of metallic Li:La:Zr:Ta was 9.6:3.0:1.40:0.60, that is, so that x=0.60 and z=1.5 in the $Li_{(7-x)z}La_3Zr_{2-x}Ta_xO_{12}$ raw material. In the powder X-ray diffraction pattern, Sample 5 was a two-phase sintered compact with an orthorhombic garnet-related structure and a cubic garnet-related structure.

Figure 17:
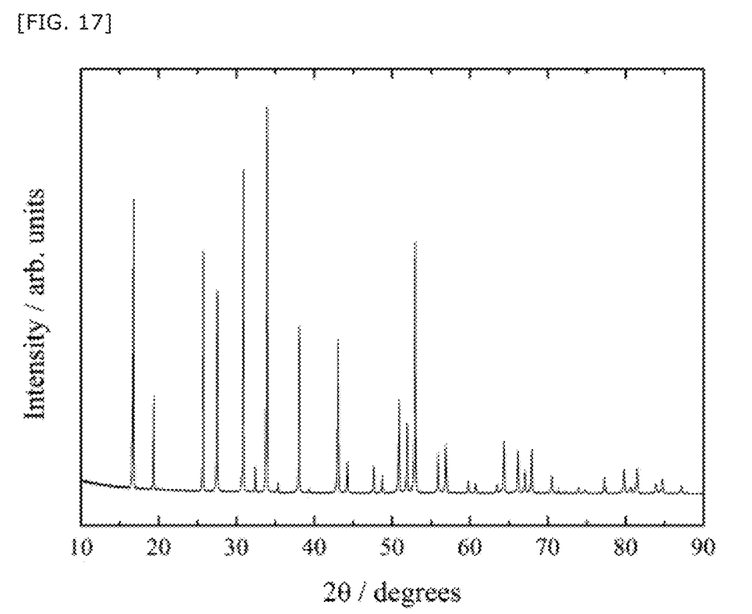
FIG. 17 is a powder X-ray diffraction pattern of the $Li_{6.4}La_3Zr_{1.40}Ta_{0.60}O_{12}$ sintered compact obtained in Example 6.
Figure 18:
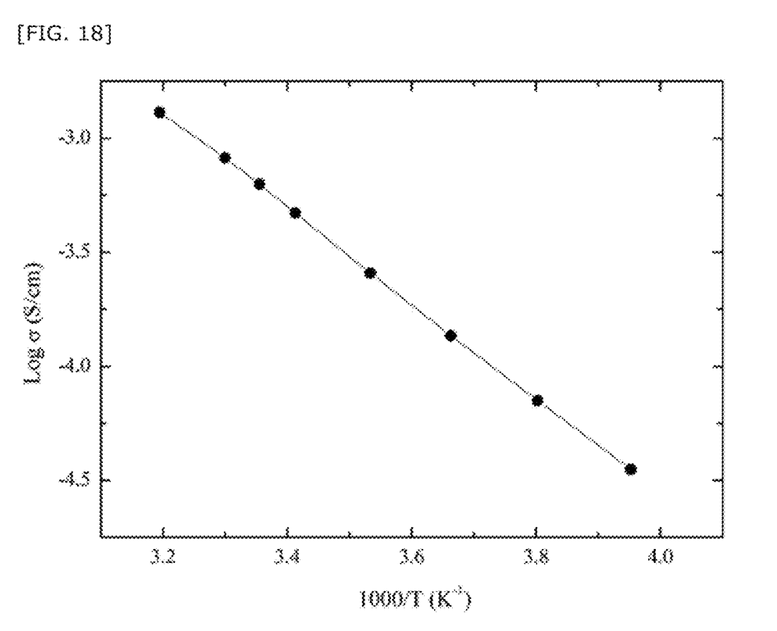
FIG. 18 is an Arrhenius plot of the $Li_{6.4}La_3Zr_{1.40}Ta_{0.60}O_{12}$ sintered compact obtained in Example 6.

When Sample 5 was pulverized and subjected to a powder X-ray diffraction measurement, the results shown in FIG. 17 were obtained. When the ratio of the phases in Sample 5 was calculated using powder X-ray diffraction measurements, it was cubic:orthorhombic=98:2. The lithium ion conductivity at 25° C. was $8.8 \times 10^{-4}$ S/cm. When the ion conductivity was determined in a range from −20° C. to 40° C., the Arrhenius plot shown in FIG. 18 was obtained, the activation energy was 0.43 eV, and the mixture combined high ion conductivity and low activation energy.

Example 7: Production of $Li_{6.75}La_3Zr_{1.75}Nb_{0.25}O_{12}$ Sintered Compact Using the Embedding Method A sintered compact ("material 6" below) was prepared and evaluated in the same manner as Example 3 except that lithium carbonate $Li_2CO_3$, lanthanum oxide $La_2O_3$, zirconium oxide $ZrO_2$, and niobium oxide $Nb_2O_5$ were mixed together so that the molar ratio of metallic Li:La:Zr:Nb was 10.125:3.0:1.75:0.25, that is, so that x=0.25 and z=1.5 in the $Li_{(7-x)z}La_3Zr_{2-x}Nb_xO_{12}$ raw material. In the powder X-ray diffraction pattern, Sample 6 was a two-phase sintered compact with an orthorhombic garnet-related structure and a cubic garnet-related structure.

Figure 19:
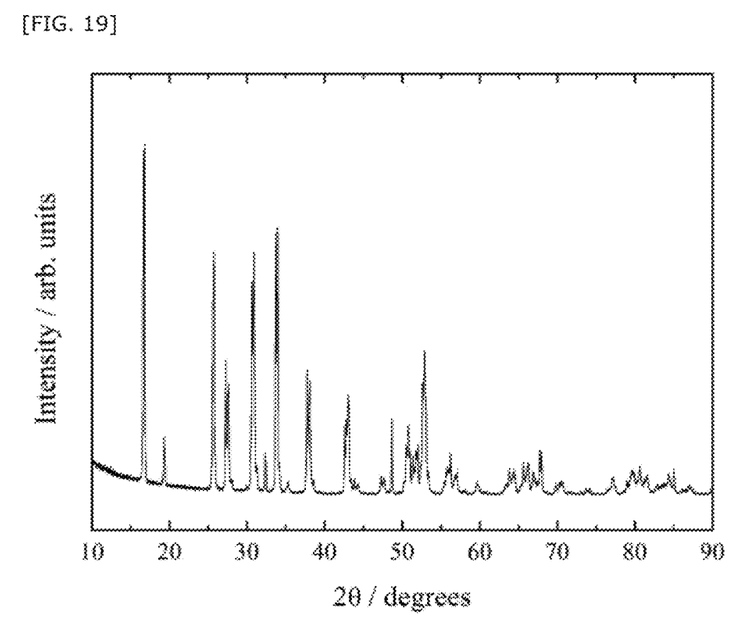
FIG. 19 is a powder X-ray diffraction pattern of the $Li_{6.75}La_3Zr_{1.75}Nb_{0.25}O_{12}$ sintered compact obtained in Example 7.
Figure 20:
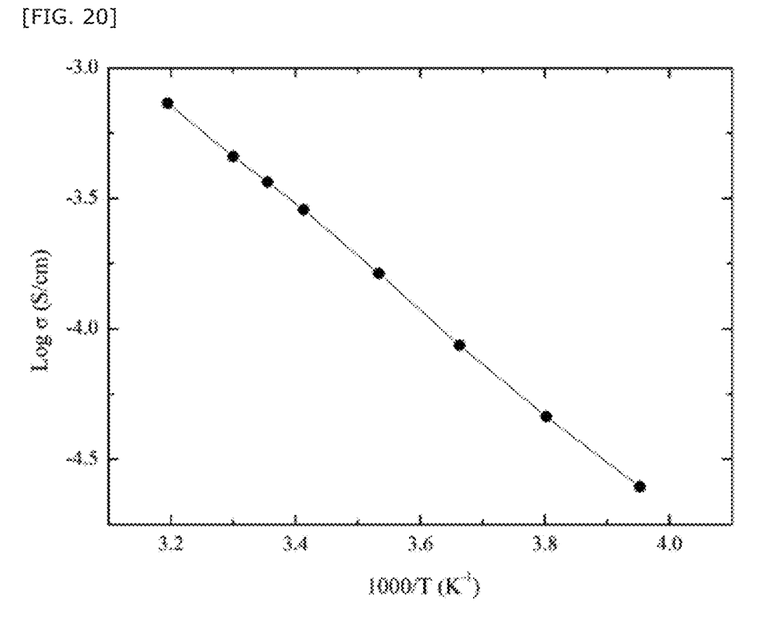
FIG. 20 is an Arrhenius plot of the $Li_{6.75}La_3Zr_{1.75}Nb_{0.25}O_{12}$ sintered compact obtained in Example 7.

When Sample 6 was pulverized and subjected to a powder X-ray diffraction measurement, the results shown in FIG. 19 were obtained. The powder X-ray diffraction pattern of Sample 6 was different from the X-ray diffraction patterns of previously reported garnet-related structure crystals. Therefore, it was clear that Sample 6 was a crystal with a novel crystal structure. In the powder X-ray diffraction pattern, the sample was a mixed-phase sintered compact that was mostly an orthorhombic garnet-related structure with a small amount of cubic garnet-related structure. The lattice constants a, b, c of the orthorhombic garnet-related structure, which is a novel crystal structure, calculated from the crystal structural analysis results were a=1.30683 nm±0.00002 nm, b=1.28869 nm±0.00003 nm, and c=1.29377 nm±0.00003 nm. When the ratio of the phases in Sample 6 was calculated using powder X-ray diffraction measurements, it was cubic:orthorhombic=97:3. The lithium ion conductivity at 25° C. was $3.6 \times 10^{-4}$ S/cm. When the ion conductivity was determined in a range from −20° C. to 40° C., the Arrhenius plot shown in FIG. 20 was obtained, the activation energy was 0.41 eV, and the mixture combined high ion conductivity and low activation energy.

Example 8: Production of all-Solid-State Lithium Ion Secondary Battery

First, 0.0105 mol lithium acetate dihydrate (Sigma-Aldrich) and 0.01 mol cobalt acetate tetrahydrate (Wako Pure Chemical Industries) were dissolved in 100 g ethylene glycol (Wako Pure Chemical Industries). Next, 10 g polyvinylpyrrolidone (K-30 from Wako Pure Chemical Industries) was added and dissolved to prepare 0.1 mol/kg lithium cobaltate precursor solution. The amount of lithium acetate was 5 mol % higher than the amount of cobalt acetate to take into consideration the vaporization of lithium during sintering.

Figure 21:
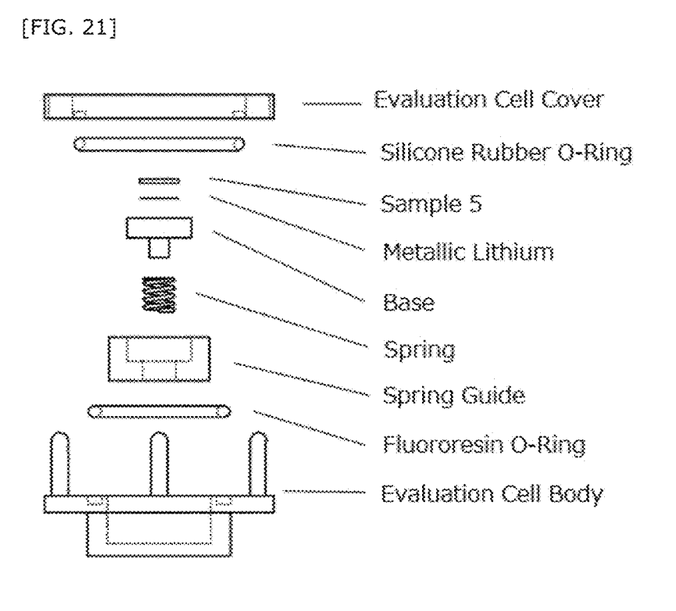
FIG. 21 is an exploded view of the all-solid-state lithium-ion secondary battery obtained in Example 8.

Next, Sample 1 was cut into a slice with a diameter of approximately 0.8 cm and a thickness of approximately 0.10 cm. After adding 10 μL of the precursor solution dropwise to the slice and performing preliminary firing for 20 minutes at 400° C., firing was performed for 10 minutes at 850° C. Lithium cobaltate was formed on the surface of Sample 1 as the positive electrode to complete the sample ("Sample 7" below). In a glove box, sample 7 and metallic lithium stamped in the form of a 4 mm-diameter disk were placed in a battery evaluation HS cell (from Hohsen Corporation) as shown in FIG. 21 to complete a all-solid-state lithium-ion secondary battery. The open circuit voltage of the all-solid-state lithium-ion secondary battery was 2.53 V, verifying that it functioned as a battery.

INDUSTRIAL APPLICABILITY

A $Li_{7-x-y}La_3Zr_{2-x-y}Ta_xNb_yO_{12}$ (0.05≤x+y≤0.2, x≥0, y≥0) crystal or the present invention or a $Li_{7-x-y}La_3Zr_{2-x-y}Ta_xNb_yO_{12}$ (0.2<x+y≤0.6, x≥0, y≥0) sintered compact of the present invention can be used in a solid electrolyte or separator for a all-solid-state lithium-ion secondary battery, lithium-air battery, or lithium-sulfur battery.

The invention claimed is:
1. A garnet-related structure crystal represented by the chemical composition $Li_{7-x-y}La_3Zr_{2-x-y}Ta_xNb_yO_{12}$ (0.05≤x+y≤0.2, x≥0, y≥0), the crystal structure being an orthorhombic system.

2. The garnet-related structure crystal according to claim 1, wherein the space group showing symmetry in the crystal structure belongs to Ibca.

3. The garnet-related structure crystal according to claim 1, wherein lattice constants a, b and c in the crystal structure satisfy 1.29 nm≤a≤1.32 nm, 1.26 nm≤b≤1.29 nm, and 1.29 nm≤c≤1.32 nm, respectively.

4. The garnet-related structure crystal according to claim 1, wherein at least four sites in the crystal structure are occupied by lithium-ions.

5. The garnet-related structure crystal according to claim 1, wherein the lithium-ion conductivity at 25° C. is at least $1.0 \times 10^{-4}$ S/cm.

6. The garnet-related structure crystal according to claim 1, wherein the relative density is at least 99%.

7. The garnet-related structure crystal according to claim 6, wherein the relative density is 100%.

8. A garnet-related structure sintered compact comprising: the garnet-related structure crystal according to claim 1; and a crystal having a cubic garnet-related structure crystal represented by the chemical composition $Li_{7-x-y}La_3Zr_{2-x-y}Ta_xNb_yO_{12}$ (0.2<x+y≤0.6, x≥0, y≥0).

9. An all-solid-state lithium-ion secondary battery comprising: a positive electrode, a negative electrode, and a solid electrolyte containing the garnet-related structure crystal according to claim 1.

10. An all-solid-state lithium-ion secondary battery comprising: a positive electrode, a negative electrode, and the garnet-related structure sintered compact according to claim 8.

11. A method for manufacturing a garnet-related structure crystal belonging to an orthorhombic system represented by the chemical composition $Li_{7-x-y}La_3Zr_{2-x-y}Ta_xNb_yO_{12}$ (0.05≤x+y≤0.2, x≥0, y≥0), the method comprising melting at least a portion of a raw material represented by the chemical composition $Li_{(7-x-y)z}La_3Zr_{2-x-y}Ta_xNb_yO_{12}$ (0.05≤x+y≤0.2, x≥0, y≥0, 1<z≤2) to form a molten portion for crystal growth; moving the molten portion for crystal growth to an uncrystallized raw material at a traveling rate of at least 8 mm/h; and conducting crystal growth.

\* \* \* \* \*